United States Patent
Spehl et al.

(10) Patent No.: US 11,394,411 B2
(45) Date of Patent: Jul. 19, 2022

(54) TRANSMITTING/RECEIVING SYSTEM FOR RADIO SIGNALS HAVING AN INTEGRATED TRANSMISSION AMPLIFIER PROTECTION FUNCTION

(71) Applicant: AUDI AG, Ingolstadt (DE)

(72) Inventors: Jürgen Spehl, Wettstetten (DE); Lars Reichardt, Wettstetten (DE); Aurel Papp, Karlskron (DE)

(73) Assignee: Audi AG, Ingolstadt (DE)

( * ) Notice: Subject to any disclaimer, the term of this patent is extended or adjusted under 35 U.S.C. 154(b) by 0 days.

(21) Appl. No.: 17/263,445

(22) PCT Filed: Jul. 17, 2019

(86) PCT No.: PCT/EP2019/069260
§ 371 (c)(1),
(2) Date: Jan. 26, 2021

(87) PCT Pub. No.: WO2020/025327
PCT Pub. Date: Feb. 6, 2020

(65) Prior Publication Data
US 2021/0273666 A1    Sep. 2, 2021

(30) Foreign Application Priority Data
Aug. 3, 2018 (DE) ..................... 10 2018 213 029.9

(51) Int. Cl.
*H04B 1/04* (2006.01)
*H03F 3/189* (2006.01)
(Continued)

(52) U.S. Cl.
CPC ........... *H04B 1/0458* (2013.01); *H03F 3/189* (2013.01); *H03F 3/24* (2013.01); *H04B 1/3822* (2013.01);
(Continued)

(58) Field of Classification Search
CPC .... H04B 1/0458; H04B 1/3822; H04B 1/745; H04B 17/103; H03F 3/189; H03F 3/24; H03F 2200/451
See application file for complete search history.

(56) References Cited

U.S. PATENT DOCUMENTS 5,659,322 A * 8/1997 Caille ................... H01Q 21/245
342/188
5,822,684 A * 10/1998 Kitakubo .................. H01P 1/15
455/277.1
(Continued)

FOREIGN PATENT DOCUMENTS

DE    4410542 A1    9/1995
DE    102006021514 A1    11/2007
EP    0905915 A2    3/1999

OTHER PUBLICATIONS

International Search Report and Written Opinion of the International Searching Authority directed to related International Patent Application No. PCT/EP2019/069260, dated Nov. 27, 2019, with attached English-language translation; 27 pages.
(Continued)

*Primary Examiner* — Jaison Joseph
(74) *Attorney, Agent, or Firm* — Sterne, Kessler, Goldstein & Fox P.L.L.C.

(57) ABSTRACT

A system for transmitting and receiving radio signals is disclosed. The system includes a controller having a modem and a transmission amplifier module connected to the modem, an antenna unit arranged at a distance from the controller and having an antenna and a reception amplifier module connected to the antenna, and a high-frequency cable connecting the controller and the antenna unit.

17 Claims, 3 Drawing Sheets

(51) Int. Cl.
   *H03F 3/24* (2006.01)
   *H04B 1/3822* (2015.01)
   *H04B 1/74* (2006.01)
   *H04B 17/10* (2015.01)

(52) U.S. Cl.
   CPC ....... *H04B 1/745* (2013.01); *H03F 2200/451* (2013.01); *H04B 17/103* (2015.01)

(56) References Cited

U.S. PATENT DOCUMENTS

| | | | |
|---|---|---|---|
| 9,866,259 B1* | 1/2018 | Margomenos | H04B 7/0413 |
| 2003/0156060 A1* | 8/2003 | Revankar | H01Q 21/0025 |
| | | | 342/372 |
| 2007/0264934 A1 | 11/2007 | Holder et al. | |
| 2007/0281631 A1 | 12/2007 | Nast | |
| 2008/0309565 A1 | 12/2008 | Villarroel et al. | |
| 2009/0023477 A1 | 1/2009 | Staudte | |
| 2012/0021790 A1 | 1/2012 | Kister et al. | |
| 2013/0015923 A1* | 1/2013 | McKinley | H01P 1/122 |
| | | | 333/17.1 |
| 2013/0059555 A1 | 3/2013 | Lee | |
| 2013/0215804 A1 | 8/2013 | Lu et al. | |
| 2017/0230925 A1* | 8/2017 | Meiyappan | H04W 40/244 |
| 2018/0019733 A1 | 1/2018 | Tiwari et al. | |
| 2018/0026592 A1* | 1/2018 | Wallis | H03F 1/523 |
| | | | 330/302 |
| 2019/0356278 A1* | 11/2019 | Smith, Jr. | H04B 7/0868 |

OTHER PUBLICATIONS

International Preliminary Report on Patentability directed to related International Patent Application No. PCT/EP2019/069260, completed Nov. 26, 2020, with attached English-language translation; 15 pages.

* cited by examiner

TRANSMITTING/RECEIVING SYSTEM FOR RADIO SIGNALS HAVING AN INTEGRATED TRANSMISSION AMPLIFIER PROTECTION FUNCTION

TECHNICAL FIELD

The present disclosure relates to a system for transmitting and receiving radio signals that includes a controller having a modem and a transmission amplifier module connected to the modem, an antenna unit arranged at a distance from the controller and having an antenna and a reception amplifier module connected to the antenna, and a high-frequency cable connecting the controller and the antenna unit.

BACKGROUND

In such systems, the modem is designed to transmit (TX) and receive (RX) radio signals by means of the antenna, and is therefore usually designated a TRX modem. In order to transmit high frequency (HF) signals between the modem and the antenna, the system includes a high-frequency cable via which the modem and the antenna are connected to one another.

However, the signals are inevitably attenuated as they are transmitted in the high-frequency cable. The attenuation by the cable, the so-called cable attenuation, is greater the longer the high-frequency cable on the one hand and the higher the frequency of the signals on the other. As a result of the cable attenuation, the transmission quality can suffer, which leads, for example, to bit errors that are noticeable as call drops in mobile radio communications, and the range and reception quality of a radio connection are reduced. Nevertheless, it is often desirable or unavoidable to arrange the TRX modem and the antenna at a spatial distance in spite of the high signal frequencies.

In order to counteract the attenuation of the signals by the cable in such cases, transmission amplifier modules, e.g., a power amplifier (PA) and/or reception amplifier modules, e.g., a low noise amplifier (LNA) are usually looped into the respective signal path, i.e., the transmission path or reception path. Reception amplifier modules are mostly integrated in the antenna unit in order to counteract noise from received signals, i.e., to reduce a noise figure of the reception path. In many cases, for example, reception amplifier modules are also integrated into the antenna unit for the sake of easy handling.

EP 0 905 915 A2 discloses such a system designed as a mobile radio adapter. The mobile radio adapter includes an antenna and in each case a reception amplifier module or transmission amplifier module arranged adjacent to the antenna and connected to the antenna. A mobile terminal device, which is arranged at a distance from the reception amplifier module, can be connected to the mobile radio adapter via two cables, one of the two cables being assigned exclusively to the transmission path and the reception path.

A system of the type mentioned at the beginning can be installed in particular in a vehicle, mostly in a motor vehicle, in order to allow the vehicle to have radio communication, for example, with an external mobile radio network, external WLAN access, an external Bluetooth device, or with other vehicles (Car2X).

DE 44 10 542 A1 discloses a system for using a mobile terminal device in a vehicle. The system comprises an external antenna and a reception amplifier module arranged adjacent to the external antenna and connected to the external antenna, and a transmission amplifier module arranged inside the vehicle. The reception amplifier module and the transmission amplifier module are connected to one another by means of two coaxial cables which are each assigned exclusively to the transmission path and the reception path.

DE 10 2006 021 514 A1 discloses another mobile radio participant system for a vehicle having an antenna, a reception amplifier module arranged adjacent to the antenna and connected to the antenna, a coaxial cable, and a transmission amplifier module connected to the reception amplifier module via the coaxial cable. The coaxial cable is assigned to the transmission path and the reception path at the same time. A mobile terminal device can be connected to the transmission amplifier module.

US 2013/0215804 A1 discloses a system having a controller and an antenna unit which is arranged at a distance from the controller and which comprises a protection circuit against a malfunction of a specific component of the antenna unit.

But even if the components of a system as described above are not sufficiently tuned in accordance with one another, the function of the system can already be impaired or the transmission amplification module can be damaged or destroyed, for example, by reflections in the high-frequency cable. Inadequate tuning can easily result from a specific installation situation of the system, an incorrect setting of the amplifier modules, or the like.

BRIEF DESCRIPTION OF THE DRAWINGS/FIGURES

DETAILED DESCRIPTION

Figure 1:
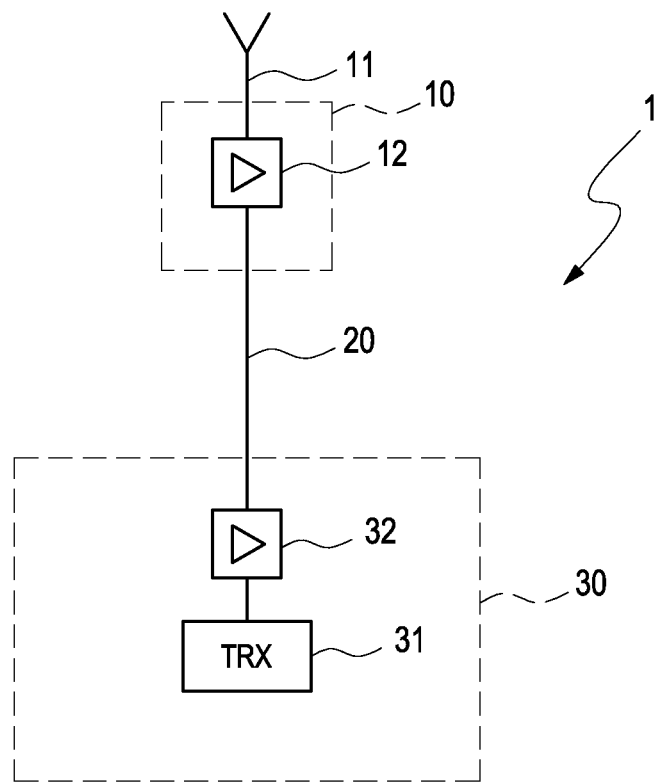
FIG. 1 is a schematic representation of a block diagram of a system for transmitting and receiving radio signals.

The present disclosure is, therefore, based on the object of creating an improved system for transmitting and receiving radio signals, which avoids the disadvantages described above, and is extremely robust.

The present disclosure relates to a system for transmitting and receiving radio signals that includes, in some embodiments, a controller having a modem and a transmission amplifier module connected to the modem, an antenna unit arranged at a distance from the controller and having an antenna and a reception amplifier module connected to the antenna, and a high-frequency cable connecting the controller and the antenna unit. The system is versatile and can be installed in particular in motor vehicles. In these cases, the controller can be a so-called telematics controller. The transmission path is looped past the reception amplifier module and the reception path is looped past the transmission amplifier module.

In some embodiments, the antenna unit includes a protection circuit for protecting the transmission amplifier module and/or the modem, which protection circuit includes a protection switch having a reflection detector and also a terminating resistor and/or a bypass line and is configured to route a transmitted signal past the reception amplifier module to the antenna or to the terminating resistor by means of the bypass line if a reflection power detected by the reflection detector exceeds a predetermined threshold value. The protection circuit, also known as VSWR (voltage standing wave ratio) protective circuit, effectively prevents the transmission amplifier module or the modem from being damaged by a signal reflection in the high-frequency cable in the event of poor tuning. In such a case, the protection switch connects the signal output of the transmission amplifier module to the terminating resistor, for example, dummy load, usually 50 ohms, or via the bypass line to the antenna if the reflection detector detects harmful reflection power. In this way, damage or destruction of the transmission amplifier module or the modem is effectively prevented.

In some embodiments, a system for transmitting and receiving radio signals includes a controller having a modem and at least one transmission amplifier module connected to the modem, at least one antenna unit arranged at a distance from the controller and having an antenna and a reception amplifier module connected to the antenna, and a high-frequency cable connecting the modem of the controller and the at least one antenna unit, and which includes a further antenna and a further high-frequency cable connecting the transmission amplifier module of the controller and the further antenna. The system separates the reception path from the transmission path, as a result of which the transmission amplifier modules are protected from signal reflection in the high-frequency cable. In this way, damage or destruction of the transmission amplifier module or the modem is effectively prevented.

In some embodiments, the transmission amplifier module is arranged at the modem and only the reception amplifier module is integrated into the antenna unit. This arrangement offers the advantage that the transmission amplifier module and the modem can be integrated in terms of circuit technology, i.e., arranged on the same printed circuit board (PCB), the modem taking over the control of the transmission amplifier module. Accordingly, external control lines between the modem and the transmission amplifier module can otherwise be omitted. In addition, the transmission power of the modem can be reduced, since the signals transmitted by the modem are amplified by the transmission amplifier module before being transmitted through the high-frequency cable.

In some embodiments, the system is designed to transmit and receive radio signals with a frequency above 3 GHz. At frequencies above 3 GHz, the attenuation by the high-frequency cable is very strong. Both frequency bands for mobile radio (3.5 GHz) and frequency bands for Car2X radio communication (5.9 GHz) are above 3 GHz.

In some embodiments, an amplification factor of the transmission amplifier module and/or the reception amplifier module is equal to or greater than an attenuation factor of the high-frequency cable, and/or the transmission amplifier module and the reception amplifier module are symmetrically dimensioned. The attenuation factor corresponds to a loss of attenuation of a signal in the high-frequency cable, i.e., to a power loss caused by the cable. The power loss is, therefore, compensated for by an amplification power that corresponds to the amplification factor that is at least as large. The symmetrical dimensioning results in a balanced power transmission balance or within a link budget between the transmission direction and the reception direction, which is primarily required for radio services that require certification, such as Bluetooth and Car2X.

In some embodiments, the system includes an actuator for, in particular, automatic setting an amplification factor of the transmission amplifier module and/or the reception amplifier module. By way of a non-limiting example, the actuator can be implemented as software in order to provide the amplification factor in a flexibly adjustable manner. In this way, the amplification factor can be coded, i.e., the amplification power of the transmitter amplifier module and/or of the reception amplifier module can be set as a function of the attenuation by the high-frequency cable. The actuator can be designed with or without feedback. In the latter case, the actuator can be connected to a detector which detects the attenuation of the high-performance cable in order to form a control loop for the amplification factor. The amplification factor is automatically and dynamically adjusted to different lengths of the high-performance cable by means of the control loop.

In some embodiments, by way of a non-limiting example, the system can include an actuator for, in particular, automatically setting a usable frequency range and/or be designed in particular for automatic tuning of a usable frequency. Depending on the bandwidth and/or number of supported radio service channels, the actuator allows tuning, in particular readjustment (synchronization) of the transmission amplifier module and/or the reception amplifier module with regard to the frequencies used (TRX control loop). The actuator can be part of a control loop in order to allow automatic and dynamic tuning.

In some embodiments, the antenna unit includes a particularly scalable high-frequency module, in particular a filter, a mixer, a switch, or a duplexer/triplexer. The type and number of high-frequency modules depends on the bandwidth and/or the number of radio service channels supported.

In some embodiments, the high-frequency module can be connected upstream of the transmission amplifier module and/or the reception amplifier module in a transmission direction and/or in a reception direction. By way of a non-limiting example, the high-frequency module can be looped into the transmission path and/or into the reception path on the antenna side or on the modem side.

In some embodiments, the system is designed to transmit and receive radio signals from different radio services and, in particular, the antenna unit includes a combiner or a frequency multiplexer. The combiner or the frequency multiplexer allow the use of a single high-frequency cable for the simultaneous or parallel transmission of radio signals from different radio services, i.e., different frequencies and bandwidths related to global system for mobile communication (GSM), universal mobile telecommunications system (UMTS), long term evolution (LTE) mobile radio services and cooperative vehicle-to-anything communication (Car2X) services.

In some embodiments, the system includes a diagnostic unit for checking the functionality of the high-frequency cable. The diagnostic unit can be based on a direct current (DC) resistance measurement. By way of a non-limiting example, the diagnostic unit can use a current window or a pulse width modulation signal for measurement purposes. An interruption, short circuit, or pinching of the high-frequency cable on its installation route (remote installation) can be reliably recognized by means of the diagnostic unit.

In some embodiments, the system is configured to apply a direct current to the reception amplifier module via the high-frequency cable, and in particular comprises a bias T, which for example may be designated as bias tee, and/or a direct current blocker (DC blocker). This allows the controller to supply the antenna unit without connecting the antenna unit to a separate power cable. In this way, the antenna unit does not have to be specifically connected to the on-board electrical system, for example, in a vehicle.

In the drawings, the invention is depicted schematically by means of embodiments and will be further described with reference to the drawings.

FIG. 1 is a schematic representation of a block diagram of a system 1 for transmitting and receiving radio signals, which system is installed, for example, in a motor vehicle.

The system 1 includes a controller 30 having a modem 31 and a transmission amplifier module 32 connected to the modem 31, an antenna unit 10 arranged at a distance from the controller 30 and having an antenna 11 and a reception amplifier module 12 connected to the antenna 11, and a high-frequency cable 20 connecting the controller 30 and the antenna unit 10. The system 1 is designed to transmit and receive radio signals with a frequency above 3 GHz and accordingly also allows the use of radio services whose frequency bands have high frequencies. The transmission path is at the reception amplifier module 12, and the reception path is looped past the transmission amplifier module 32, i.e., the reception amplifier module 12 is not in the transmission path and the transmission amplifier module 32 is not in the reception path.

Figure 2:
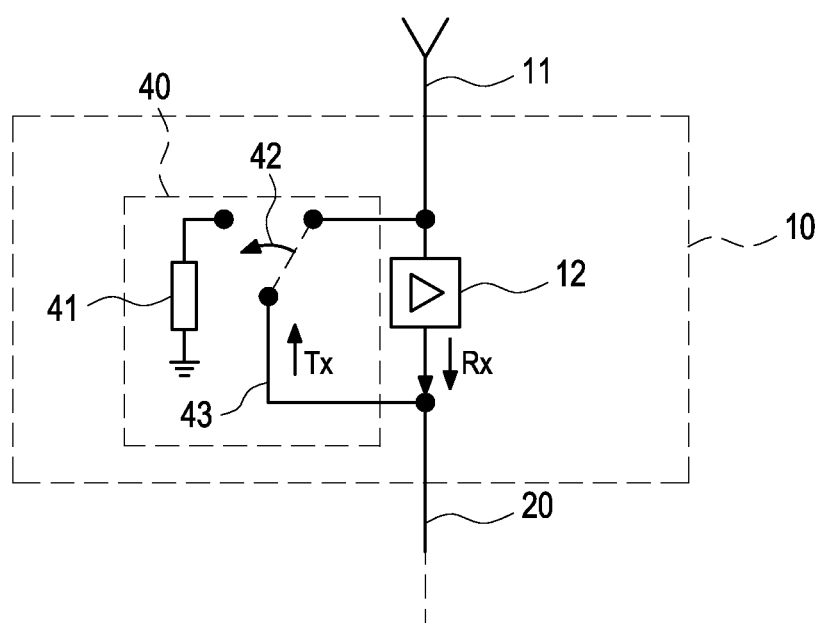
FIG. 2 is a schematic representation of a block diagram of an antenna unit of a system for transmitting and receiving radio signals according to an embodiment of the present disclosure.

FIG. 2 shows, in a schematic representation, a block diagram of an antenna unit 10 of a system for transmitting and receiving radio signals according to an embodiment of the present disclosure.

In the system, an amplification factor of the transmission amplifier module 32, as shown in FIG. 1, and/or of the reception amplifier module 12 is equal to or greater than an attenuation factor of the high-frequency cable 20. The transmission amplifier module 32 and the reception amplifier module 12 are also dimensioned symmetrically.

The system further includes a diagnostic unit (not shown) for checking the functionality of the high-frequency cable 20 and is designed to apply a direct current to the reception amplifier module 12 via the high-frequency cable 20. It also includes a bias T and a DC blocker (both not shown).

Furthermore, the antenna unit 10 includes a protection circuit 40 (VSWR protection circuit) for protecting the transmission amplifier module 32 and/or the modem 31. The protection circuit 40 includes a protection switch 42 having a reflection power detector, a terminating resistor 41, and a bypass line 43 and is configured to route a transmitted signal past the reception amplifier module 12 to the antenna 11 or to the terminating resistor 41 by means of the bypass line 43 if a reflection power detected by the reflection power detector exceeds a predetermined threshold value. The protection switch 42 can be designed as a semiconductor (HL) switch.

Figure 3:
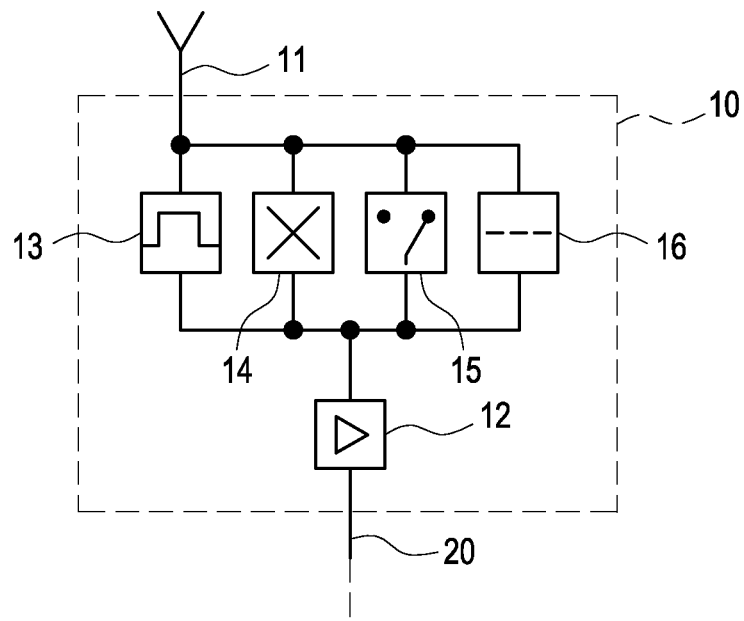
FIG. 3 is a schematic representation of a block diagram of an antenna unit of a system for transmitting and receiving radio signals according to a further embodiment of the present disclosure.

FIG. 3 shows, in a schematic representation, a block diagram of an antenna unit 10 of a system for transmitting and receiving radio signals according to a further embodiment of the present disclosure. The system has the same structure as the system shown in FIG. 2, the protection circuit 40 not being shown here for the sake of clarity.

The system includes one or more scalable high-frequency modules, which are shown in FIG. 3, by way of a non-limiting example, as a filter 13, a mixer 14, a switch 15, and a duplexer/triplexer 16. The high-frequency modules are looped in between the antenna 11 and the reception amplifier module 12 and are connected upstream of the reception amplifier module 12 in a reception direction.

Figure 4:
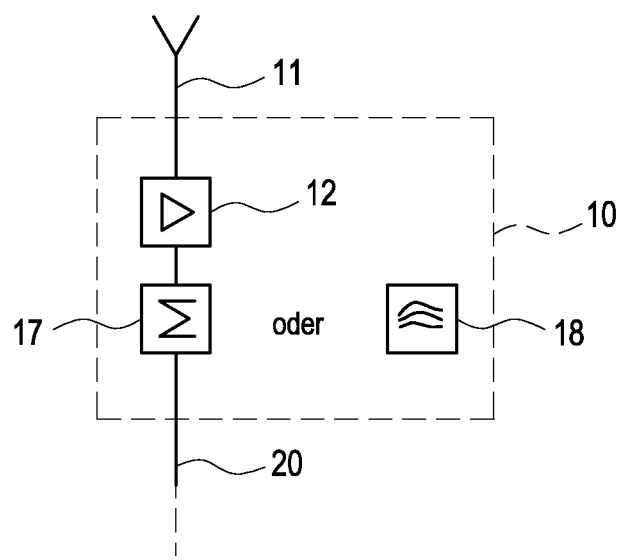
FIG. 4 is a schematic representation of a block diagram of an antenna unit of a system for transmitting and receiving radio signals according to a third embodiment of the present disclosure.

FIG. 4 shows, in a schematic representation, a block diagram of an antenna unit 10 of a system for transmitting and receiving radio signals according to a third embodiment of the present disclosure. The system has the same structure as the system shown in FIG. 2, the protection circuit 40 not being shown here for the sake of clarity.

The system is designed to transmit and receive radio signals from different radio services related to GSM, UMTS, LTE mobile radio services, and Car2X services and the antenna unit 10 includes a combiner 17, but can also include a frequency multiplexer 18, which is shown in FIG. 4 as an alternative.

Figure 5:
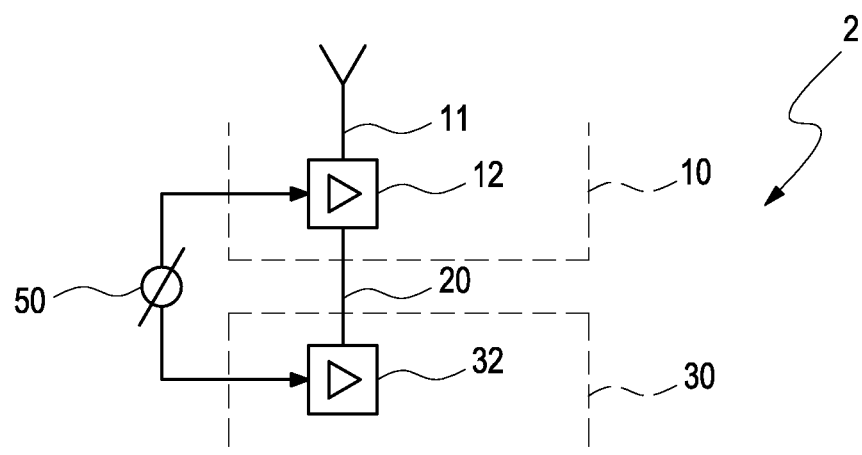
FIG. 5 is a schematic representation of a block diagram of a system for transmitting and receiving radio signals according to a fourth embodiment of the present disclosure.

FIG. 5 shows a schematic representation of a block diagram of a system 2 for transmitting and receiving radio signals according to a fourth embodiment of the present disclosure. The system 2 includes an actuator 50 for automatically setting an amplification factor of the transmission amplifier module 32 and the reception amplifier module 12. By way of a non-limiting example, the actuator 50 can be designed to automatically set a usable frequency range or to automatically tune a usable frequency.

Figure 6:
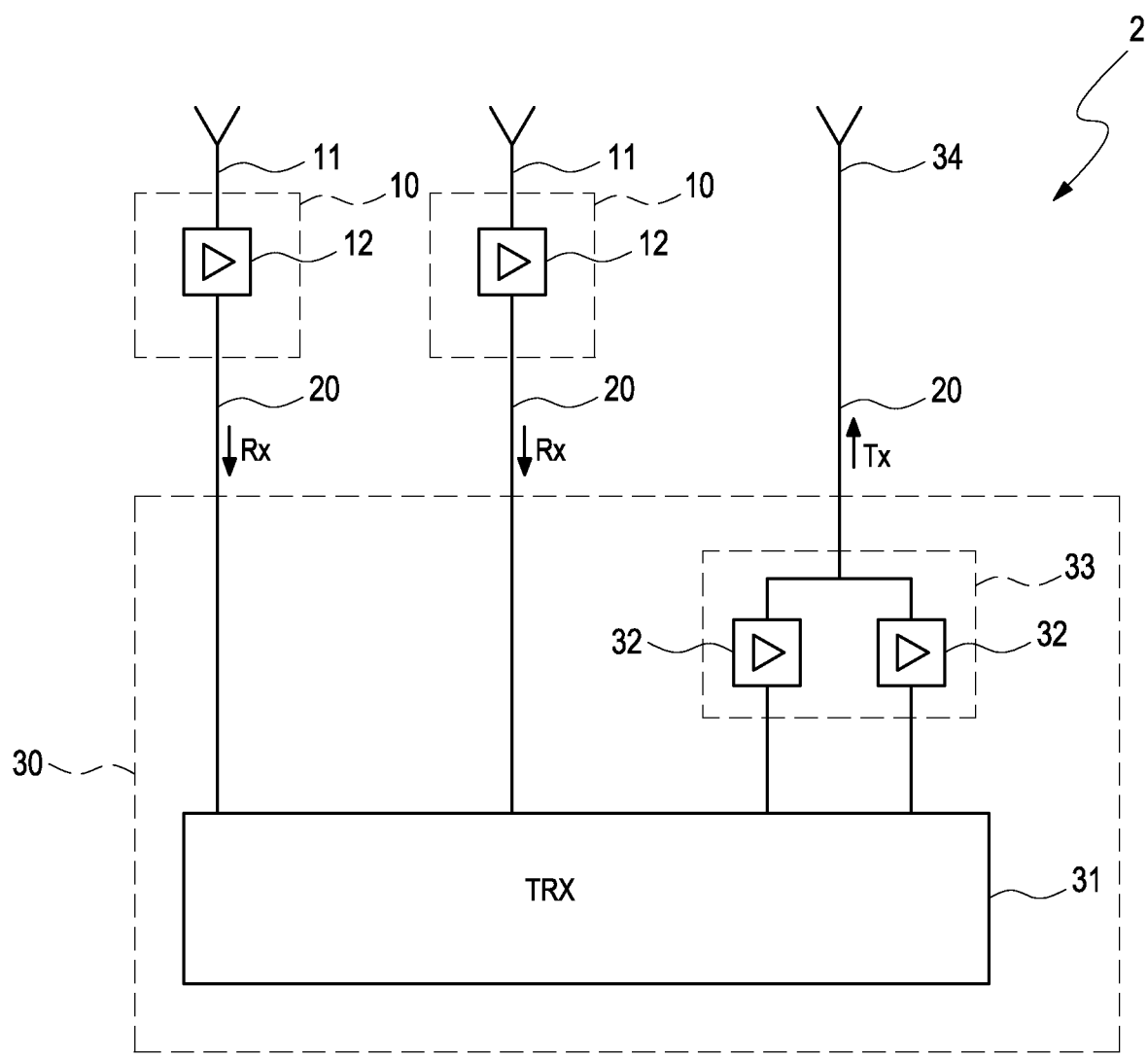
FIG. 6 is a schematic representation of a block diagram of a system for transmitting and receiving radio signals according to a fifth embodiment of the present disclosure.

FIG. 6 shows, in a schematic representation, a block diagram of a system 2 for transmitting and receiving radio signals according to a fifth embodiment of the present disclosure. The system 2 includes a controller 30 having a modem 31, two transmission amplifier modules 32 connected to the modem 31, which are combined to form a transmission amplifier unit 33, an antenna 34 at a distance from the control unit 30 and a high-frequency cable 20 connecting the transmission amplifier modules 32 of the controller 30 and the antenna 34.

Furthermore, the system 2 includes two antenna units 10 arranged at a distance from the controller 30, each having an antenna 11 and a reception amplifier module 12 connected to the antenna 11, as well as two high-frequency cables 20 connecting the modem 31 of the controller 30 and the antenna units 10. The transmission path having the antenna 34 is completely separated from the two reception paths having the antenna units 10, i.e. the antennas 11 serve exclusively as reception antennas (RX) and the antenna 34 serves exclusively as a transmission antenna (TX).

A person skilled in the art understands that the features of the embodiments of the present disclosure shown can be freely combined in any number, depending on the purpose and requirement.

A substantial advantage of the system 2 according to the present disclosure for transmitting and receiving radio signals is that it has great robustness with regard to different installation situations and thus different lengths of the high-frequency cable 20 while being versatile. Further advantages can be seen in the simple structure of the system 2 and in the suitability of the system 2 for high frequencies of the radio signals.

List of Reference Signs:
1 System
2 System
10 Antenna unit
11 Antenna
12 Reception amplifier module
13 Filter
14 Mixer
15 Switch
16 Duplexer/triplexer 17 Combiner
18 Frequency multiplexer
20 High-frequency cable
30 Controller
31 Modem
32 Transmission amplifier module
33 Transmission amplifier unit
34 Antenna
40 Protection circuit
41 Terminating resistor
42 Protection switch
43 Bypass line
50 Actuator

The invention claimed is:

1. A system for transmitting and receiving radio signals, comprising:
 a controller comprising a modem and a transmission amplifier module connected to the modem;
 an antenna unit arranged at a predetermined distance from the controller;
 a reception amplifier module connected to the antenna unit; and
 a high-frequency cable connecting the controller and the antenna unit,
 wherein the antenna unit comprises a protection circuit configured for protecting the transmission amplifier module or the modem,
 wherein the protection circuit comprises:
  a protection switch comprising a reflection power detector and a terminating resistor, and
  a bypass line, and
 wherein the protection circuit is configured to route a transmitted signal past the reception amplifier module to the antenna unit or to a terminating resistor using the bypass line upon a reflection power detected by a reflection power detector exceeding a predetermined threshold value.

2. The system of claim 1, wherein the system is configured to transmit and receive radio signals of a frequency above 3 GHz.

3. The system of claim 1, wherein the transmission amplifier module or the reception amplifier module is configured for an amplification factor equal to or greater than an attenuation factor of the high-frequency cable.

4. The system of claim 1, wherein the transmission amplifier module and the reception amplifier module are symmetrically dimensioned.

5. The system of claim 1, further comprising an actuator configured for setting an amplification factor of the transmission amplifier module or the reception amplifier module.

6. The system of claim 5, wherein the actuator is configured for automatic setting.

7. The system of claim 1, further comprising an actuator configured for setting a usable frequency range or tuning a usable frequency.

8. The system of claim 7, wherein the actuator is configured for automatic setting or tuning.

9. The system of claim 1, wherein the antenna unit further comprises a high-frequency module.

10. The system of claim 9, wherein the high-frequency module is configured to be scalable.

11. The system of claim 9, wherein the high-frequency module is configured as a filter, a mixer, a switch, a duplexer, or a triplexer.

12. The system of claim 9, wherein the high-frequency module is connected upstream of the transmission amplifier module or the reception amplifier module in a transmission direction or in a reception direction.

13. The system of claim 1, wherein the system is configured to transmit and receive radio signals corresponding to a plurality of radio services.

14. The system of claim 13, wherein the antenna unit comprises a combiner or a frequency multiplexer.

15. The system of claim 1, further comprising a diagnostic unit configured for checking functionality of the high-frequency cable.

16. The system of claim 1, wherein the system is configured to apply a direct current to the reception amplifier module using the high-frequency cable.

17. A system for transmitting and receiving radio signals, the system comprising:
 a controller comprising:
  a modem, and
  at least one transmission amplifier module connected to the modem;
 at least one antenna unit arranged at a predetermined distance from the controller, the at least one antenna unit comprising:
  an antenna, and
  a reception amplifier module connected to the antenna;
 a protection circuit, wherein the protection circuit is configured to route a transmitted signal past the reception amplifier module to the antenna unit or to a terminating resistor using the bypass line upon a reflection power detected by a reflection power detector exceeding a predetermined threshold value;
 a high-frequency cable connecting the modem of the controller and the at least one antenna unit;
 an other antenna; and
 an other high-frequency cable connecting the at least one transmission amplifier module of the controller and the other antenna.

* * * * *